United States Patent
Park et al.

(10) Patent No.: US 9,276,214 B2
(45) Date of Patent: Mar. 1, 2016

(54) COMPOSITION FOR ORGANIC THIN FILM, ORGANIC THIN FILM, AND ELECTRONIC DEVICE INCLUDING THE ORGANIC THIN FILM

(71) Applicants: Samsung Electronics Co., Ltd., Suwon-Si, Gyeonggi-Do (KR); Cheil Industries Inc., Gumi-Si, Gyeongsangbuk-Do (KR)

(72) Inventors: In Sun Park, Hwaseong-si (KR); Hyung Rang Moon, Uiwang-si (KR); Jin Min Cheon, Uiwang-si (KR); Dal-Ho Huh, Uiwang-si (KR); Jong Hwan Park, Yongin-si (KR); Sung Young Yun, Suwon-si (KR); Yeong Suk Choi, Suwon-si (KR)

(73) Assignees: Samsung Electronics Co., Ltd., Gyeonggi-do (KR); Cheil Industries Inc., Gyeongsangbuk-do (KR)

( * ) Notice: Subject to any disclaimer, the term of this patent is extended or adjusted under 35 U.S.C. 154(b) by 0 days.

(21) Appl. No.: 14/192,280

(22) Filed: Feb. 27, 2014

(65) Prior Publication Data
US 2015/0000744 A1    Jan. 1, 2015

(30) Foreign Application Priority Data
Jun. 27, 2013    (KR) ........................ 10-2013-0074856

(51) Int. Cl.
*H01L 31/00* (2006.01)
*H01L 51/00* (2006.01)
*H01L 51/42* (2006.01)
*H01L 51/44* (2006.01)

(52) U.S. Cl.
CPC .......... *H01L 51/004* (2013.01); *H01L 51/0037* (2013.01); *H01L 51/0047* (2013.01); *H01L 51/4253* (2013.01); *H01L 51/442* (2013.01)

(58) Field of Classification Search
CPC .............. H01L 51/0037; H01L 51/004; H01L 51/0043; H01L 51/0047; H01L 51/442
See application file for complete search history.

(56) References Cited

U.S. PATENT DOCUMENTS

| | | | |
|---|---|---|---|
| 6,916,553 B2 * | 7/2005 | Willaert et al. | 428/690 |
| 8,999,527 B2 | 4/2015 | Lee et al. | |
| 2003/0057403 A1 | 3/2003 | Willaert et al. | |
| 2005/0214571 A1 * | 9/2005 | Kishimoto | 428/690 |
| 2010/0006153 A1 | 1/2010 | Rauscher et al. | |

(Continued)

FOREIGN PATENT DOCUMENTS

| | | |
|---|---|---|
| EP | 1401909 A2 | 8/2000 |
| EP | 1309646 A1 | 10/2009 |

(Continued)

OTHER PUBLICATIONS

J. Mater, "Journal of Materials Chemistry", Chem., 2012, 22, 25057-25064.

(Continued)

*Primary Examiner* — Eli Mekhlin
(74) *Attorney, Agent, or Firm* — Harness, Dickey & Pierce, P.L.C.

(57) ABSTRACT

A composition for an organic thin film may include a first compound having a linear alkylene oxide moiety and a haloalkyl moiety, and a second compound having conductivity and being capable of controlling a work function.

9 Claims, 3 Drawing Sheets

(56) References Cited

U.S. PATENT DOCUMENTS

| | | |
|---|---|---|
| 2012/0193619 A1* | 8/2012 | Taka et al. .................. 257/40 |
| 2012/0211730 A1 | 8/2012 | Kasama et al. |
| 2012/0298974 A1* | 11/2012 | Lee et al. .................... 257/40 |

FOREIGN PATENT DOCUMENTS

| | | |
|---|---|---|
| JP | 10-20120016377 A | 2/2012 |
| KR | 20040011487 A | 2/2004 |
| KR | 10-1023021 B1 | 3/2011 |
| KR | 10-2012-0011479 A | 2/2012 |
| KR | 10-1127226 B1 | 3/2012 |
| KR | 10-1146832 B1 | 5/2012 |
| KR | 1020120055405 A | 5/2012 |
| KR | 20120132656 A | 12/2012 |
| WO | WO-2011019044 A1 | 2/2011 |
| WO | WO-2011046166 A1 | 4/2011 |

OTHER PUBLICATIONS

Korean Office Action dated Jun. 19, 2015 issued in corresponding Korean Patent Application No. 10-2013-0074856 (full English language translation provided).

KR Application No. 10-2013-0074856 dated Dec. 1, 2015 (with English Translation).

* cited by examiner

COMPOSITION FOR ORGANIC THIN FILM, ORGANIC THIN FILM, AND ELECTRONIC DEVICE INCLUDING THE ORGANIC THIN FILM

CROSS REFERENCE TO RELATED APPLICATION

This application claims priority to and the benefit of Korean Patent Application No. 10-2013-0074856 filed in the Korean Intellectual Property Office on Jun. 27, 2013, the entire contents of which are incorporated herein by reference.

BACKGROUND

1. Field

Example embodiments provide a composition for an organic thin film, an organic thin film, and an electronic device including the organic thin film.

2. Description of the Related Art

An electronic device, e.g., a solar cell and/or an organic light emitting diode, includes a plurality of thin films, e.g., a conductive thin film, an insulation thin film, and/or a semiconductor thin film.

For example, a solar cell is a photoelectric conversion device to convert solar energy into electrical energy, it absorbs solar energy in an active layer including a p-type semiconductor and a n-type semiconductor, and produces electron-hole pairs (EHP) inside a semiconductor, and the produced electrons and holes are transferred to a n-type semiconductor and a p-type semiconductor, respectively, and collected in electrodes in order to use electrical energy outside.

As another example, an organic light emitting diode is a device to convert electrical energy into light, and includes two electrodes and an active layer, e.g., an emission layer therebetween, wherein an electron injected from one electrode and a hole injected from the other electrode are combined with each other in an active layer, e.g., an emission layer to form excitons, and excitons emit light while releasing energy.

Herein, an electronic device, e.g., a solar cell or an organic light emitting diode, may further include a thin film between the active layer and electrode in order to improve device characteristics.

SUMMARY

Example embodiments provide a composition for an organic thin film for forming an organic thin film capable of improving efficiency and life-span of a device.

Example embodiments also provide an organic thin film formed from the composition for an organic thin film.

Example embodiments also provide an electronic device including the organic thin film.

According to example embodiments, a composition for an organic thin film may include a first compound having a linear alkylene oxide moiety and a haloalkyl moiety, and a second compound having conductivity and being capable of controlling a work function.

The first compound may be represented by the following Chemical Formula 1.

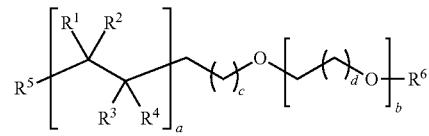

[Chemical Formula 1]

In the Chemical Formula 1, $R^1$ to $R^6$ are independently hydrogen, a substituted or unsubstituted C1 to C10 alkyl group, a halogen atom, a halogen-containing group, or a combination thereof, at least one of $R^1$ to $R^4$ is a halogen atom, or a halogen-containing group, a and b are independently integers ranging from 1 to 100, c and d are independently integers ranging from 0 to 3, and c and d are not simultaneously 0.

The first compound may be represented by the following Chemical Formula 1a.

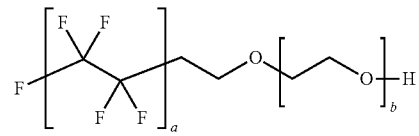

[Chemical Formula 1a]

In the Chemical Formula 1a, a and b are independently integers ranging from 1 to 100.

The second compound may include a conductive polymer, a metal salt, or a combination thereof.

The second compound may be a conductive polymer, and the conductive polymer may include moieties represented by the following Chemical Formulae 2 to 4, and at least one of a moiety represented by the following Chemical Formula 5 and a moiety represented by the following Chemical Formula 6.

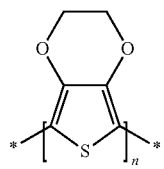

[Chemical Formula 2]

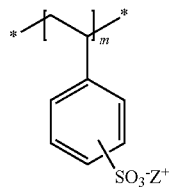

[Chemical Formula 3]

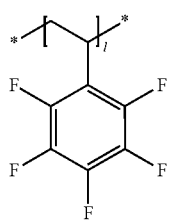

[Chemical Formula 4]

[Chemical Formula 5]

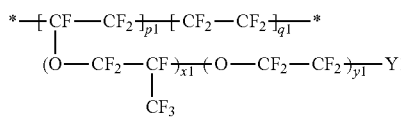

[Chemical Formula 6]

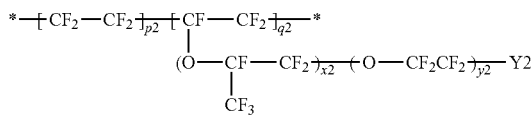

In the Chemical Formulae 2 to 6, $Z^+$ is a cation, n, m, and l denote mole numbers of each moiety represented by Chemical Formulae 2 to 4 and satisfy $0.0001 \leq n/m \leq 1$ and $0.0001 \leq l/m \leq 1$, p1, q1, p2, and q2 independently satisfy $0 < p1 \leq 10,000,000$, $0 < q1 \leq 10,000,000$, $0 < p \leq 210,000,000$, and $0 < q \leq 210,000,000$, x1, y1, x2, and y2 are independently integers ranging from 0 to 20, and Y1 and Y2 are independently $-COO^-M^+$, $-SO_3M^+$, or $-PO_3^{2-}(M^+)_2$, wherein $M^+$ is $Na^+$, $K^+$, $Li^+$, $H^+$, or $NH^{4+}$.

The second compound may be a metal salt or a metal salt hydrate, and the metal salt may be a niobium salt, a molybdenum salt, a tungsten salt, a nickel salt, a titanium salt, or a combination thereof.

The first compound may be included in an amount of about 0.001 volume % to 5 volume % based on the total amount of the composition.

The first compound may be included in an amount between greater than or equal to about 0.01 volume % and less than about 2 volume % based on the total amount of the composition.

The composition for an organic thin film may further include a solvent, and the solvent may include water, alcohol, dimethylformamide, dimethyl sulfoxide, toluene, xylene, chlorobenzene, or a combination thereof.

According to example embodiments, an organic thin film may be formed from the composition for an organic thin film of example embodiments.

According to example embodiments, an electronic device may include a first electrode, a second electrode facing the first electrode, an active layer between the first electrode and the second electrode, and an auxiliary layer between at least one of the first electrode and the active layer and the second electrode and the active layer, wherein the auxiliary layer includes a first compound having a linear alkylene oxide moiety and a haloalkyl moiety, and a second compound having conductivity and being capable of controlling a work function.

The first compound may be represented by the Chemical Formula 1.

The first compound may be represented by the Chemical Formula 1a.

The second compound may be a conductive polymer, and the conductive polymer may include moieties represented by the Chemical Formulae 2 to 4, and at least one of a moiety represented by the above Chemical Formula 5 and a moiety represented by the above Chemical Formula 6.

The second compound may be a metal oxide, and the metal oxide may include niobium oxide, molybdenum oxide, tungsten oxide, nickel oxide, titanium oxide, or a combination thereof.

The auxiliary layer may have a contact angle of about 50 to about 85 degrees.

The auxiliary layer may have a work function of about 5.2 to 5.6 eV.

The electronic device may be a solar cell or an organic light emitting diode.

DETAILED DESCRIPTION

Figure 1:
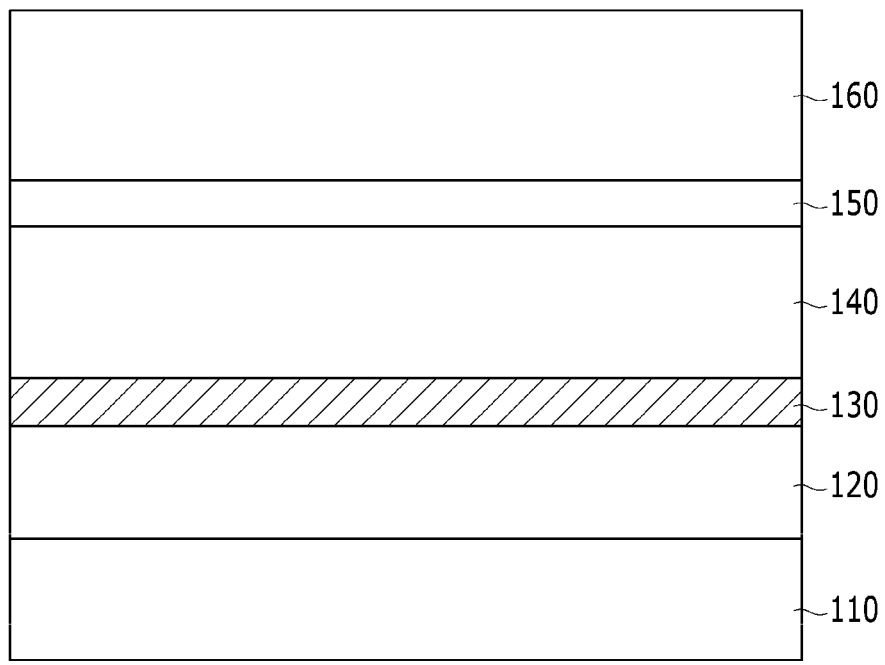
FIG. 1 is a cross-sectional view of a solar cell according to example embodiments.

Example embodiments will hereinafter be described in detail referring to the following drawings, and may be more easily performed by those who have common knowledge in the related art. However, these embodiments are only examples, and the inventive concepts are not limited thereto.

As used herein, when a definition is not otherwise provided, the term "substituted" refers to one substituted with a substituent selected from a halogen atom (F, Br, Cl, or I), a hydroxyl group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a $C_1$ to $C_{20}$ alkyl group, a $C_2$ to $C_{20}$ alkenyl group, a $C_2$ to $C_{20}$ alkynyl group, a $C_6$ to $C_{30}$ aryl group, a $C_7$ to $C_{30}$ arylalkyl group, $C_1$ to $C_4$ alkoxy group, a $C_1$ to $C_{20}$ heteroalkyl group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a $C_2$ to $C_{20}$ heterocycloalkyl group, and a combination thereof, instead of hydrogen of a compound.

As used herein, when a definition is not otherwise provided, the term "hetero" may refer to one including 1 to 3 heteroatoms selected from N, O, S, and P.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, a composition for an organic thin film according to example embodiments is described. A composition for an organic thin film according to example embodiments includes a first compound having a linear alkylene oxide moiety and a haloalkyl moiety, and a second compound having conductivity and being capable of controlling a work function.

The first compound includes a linear alkylene oxide moiety as a hydrophilic group and a haloalkyl moiety as a hydrophobic group, and thus may have improved affinity for a lower layer and improve interface characteristics with the lower layer.

The linear alkylene oxide moiety may include, for example, an alkylene oxide having 1 to 4 carbons, for example, an ethylene oxide and/or a propylene oxide.

The haloalkyl moiety includes an alkyl group substituted with at least one halogen atom, for example, —CHF—, —CF$_2$—, —CH$_2$CF$_2$, CHFCHF, or CF$_2$CF$_2$, but is not limited thereto.

The first compound may be a monomer, an oligomer, or a polymer, and the linear alkylene oxide moiety and haloalkyl moiety may be used in a ratio adjusted depending on characteristics of an organic thin film.

The first compound may be, for example, represented by the following Chemical Formula 1.

[Chemical Formula 1]

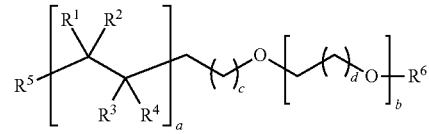

In the Chemical Formula 1, $R^1$ to $R^6$ are independently hydrogen, a substituted or unsubstituted $C_1$ to $C_{10}$ alkyl group, a halogen atom, a halogen-containing group, or a combination thereof, at least one of $R^1$ to $R^4$ is a halogen atom or a halogen-containing group, a and b are independently integers ranging from 1 to 100, c and d are independently integers ranging from 0 to 3, and c and d are not simultaneously 0.

The first compound may be, for example, represented by the following Chemical Formula 1a.

[Chemical Formula 1a]

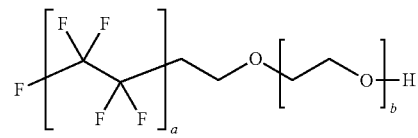

In the Chemical Formula 1a, a and b are independently integers ranging from 1 to 100.

The second compound is a conductive compound forming an organic thin film as a main component, and may be an organic compound and/or an inorganic compound.

When the second compound is an organic compound, the organic compound may be, for example, a conductive polymer.

The conductive polymer may include moieties represented by the following Chemical Formulae 2 to 4 and at least one of a moiety represented by the following Chemical Formula 5 and a moiety represented by the following Chemical Formula 6.

[Chemical Formula 2]

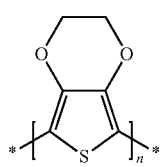

[Chemical Formula 3]

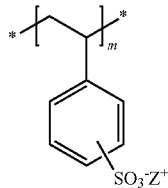

-continued

[Chemical Formula 4]

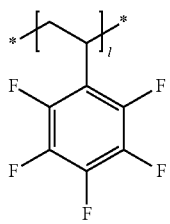

[Chemical Formula 5]

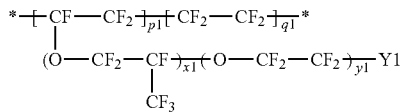

[Chemical Formula 6]

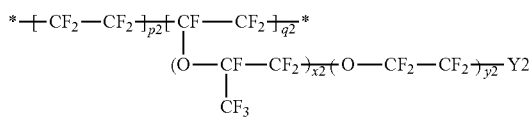

In the Chemical Formulae 2 to 6, $Z^+$ is a cation, n, m, and l denote mole numbers of each moiety represented by Chemical Formulae 2 to 4 and satisfy $0.0001 \leq n/m \leq 1$ and $0.0001 \leq l/m \leq 1$, p1, q1, p2, and q2 independently satisfy $0 < p \leq 110,000,000$, $0 < q \leq 110,000,000$, $0 < p \leq 210,000,000$, and $0 < q \leq 210,000,000$, x1, y1, x2, and y2 are independently integers ranging from 0 to 20, and Y1 and Y2 are independently $-COO^-M^+$, $-SO_3M^+$, or $-PO_3^{2-}(M^+)_2$, wherein $M^+$ is $Na^+$, $K^+$, $Li^+$, $H^+$, or $NH^{4+}$.

The conductive polymer may have a work function adjusted depending on a ratio of moieties represented by the Chemical Formulae 3 to 6, for example, a work function desired for an organic thin film, and specifically, a work function ranging from about 5.2 to about 5.6 eV.

When the second compound is an inorganic compound, the second compound may be, for example, a metal salt or a metal salt hydrate. The metal salt or the metal salt hydrate may be a precursor of a metal oxide and thus may be formed into a metal oxide through for example a sol-gel process.

The metal salt may include, for example, at least one selected from a metal hydroxide; a metal alkoxide; a metal citrate; a metal acetate; a metal carbonylate; a metal acetylacetonate; a metal acrylate; a metal halide, e.g., a metal fluoride or a metal chloride; a metal thiocarbamate, e.g., a metal dimethyldithiocarbamate or a metal diethyldithiocarbamate; a metal hexafluoroacetylacetonate; a metal metacrylate; a metal carbonate; a metal nitrate; a metal sulfate; a metal phosphate; a metal trifluoromethanesulfonate; a metal undecylenate; a metal trifluoroacetate; a metal tetrafluoroborate; and a metal perchlorate.

The metal salt may include, for example, a niobium salt, a molybdenum salt, a tungsten salt, a nickel salt, a titanium salt, or a combination thereof, but is not limited thereto. The niobium salt, molybdenum salt, tungsten salt, nickel salt, titanium salt, and oxides thereof may produce, for example, niobium oxide, molybdenum oxide, tungsten oxide, nickel oxide, and titanium oxide, respectively, through a sol-gel process.

The composition for an organic thin film may further include a solvent, and the solvent may be any one that dissolves or disperses the first compound and the second compound without particular limitation. The solvent may include at least one selected from, for example, deionized water, methanol, ethanol, propanol, isopropanol, 2-methoxyethanol, 2-ethoxyethanol, 2-propoxyethanol 2-butoxyethanol, methylcellosolve, ethylcellosolve, diethyleneglycolmethylether, diethyleneglycolethylether, dipropyleneglycolmethylether, toluene, xylene, hexane, heptane, octane, ethylacetate, butylacetate, diethyleneglycoldimethylether, diethyleneglycoldimethylethylether, methylmethoxypropionic acid, ethylethoxypropionic acid, ethyllactic acid, propyleneglycolmethyletheracetate, propyleneglycolmethylether, propyleneglycolpropylether, methylcellosolveacetate, ethylcellosolveacetate, diethyleneglycolmethylacetate, diethyleneglycolethylacetate, acetone, methylisobutylketone, cyclohexanone, dimethylformamide (DMF), dimethylsulfoxide, N,N-dimethylacetamide (DMAc), N-methyl-2-pyrrolidone, γ-butyrolactone, diethylether, ethyleneglycoldimethylether, diglyme, tetrahydrofuran, acetylacetone, chlorobenzene, and acetonitrile.

The first compound may be included in an amount of about 0.001 volume % to 5 volume % based on the total amount of the composition. When the first compound is included within the range, conductivity of an organic thin film formed of the composition may be secured, but also an interface characteristic with a lower layer may be further improved. Within the range, the compound may be included in an amount of greater than or equal to about 0.01 volume % to less than about 2 volume %.

The second compound may be included in an amount of about 0.1 to 10 wt % based on the total amount of the composition. When the second compound is included within the range, improved coating properties of an organic thin film may be obtained while securing conductivity. Within the range, the second compound may be included in an amount of about 1.5 to about 2 wt %.

The aforementioned composition for an organic thin film may be applied on a lower layer, e.g., a substrate, a conductive layer, a semiconductor layer, or an insulation layer, and form an organic thin film.

The organic thin film may have conductivity and simultaneously a work function adjusted depending on a use purpose. The organic thin film may have, for example, a work function ranging from about 5.2 to about 5.6 eV.

In addition, the organic thin film may be highly hydrophobic on the surface and have a contact angle ranging from about 50° to about 85°. Herein, the contact angle may be obtained by measuring an angle between the organic thin film and a droplet after dripping diiodomethane on the surface of the organic thin film.

The organic thin film may be applied to an electronic device.

The electronic device may be any device that needs a conductive organic thin film, and may be, for example, a solar cell or an organic light emitting diode.

Hereinafter, as an example of the electronic device, a solar cell is described referring to drawings.

FIG. 1 is a cross-sectional view of a solar cell according to example embodiments. Referring to FIG. 1, a solar cell 100 according to example embodiments includes a substrate 110, a lower electrode 120, an auxiliary layer 130, an active layer 140, an auxiliary layer 150, and an upper electrode 160.

The substrate 110 may be made of a light transmittance material, for example, an inorganic material, e.g., glass, or an organic material, e.g., polycarbonate, polymethylmethacrylate, polyethyleneterephthalate, polyethylenenaphthalate, polyamide, polyethersulfone, or a combination thereof.

The lower electrode 120 may be made of a transparent conductor, e.g., indium tin oxide (ITO) or indium zinc oxide (IZO). The lower electrode 120 may be an anode or a cathode.

The auxiliary layer 130 may increase charge mobility between the lower electrode 120 and the active layer 140, and may be, for example, at least one selected from a hole injection layer, a hole transport layer, an electron blocking layer, an electron injection layer, an electron transport layer, and a hole blocking layer, without limitation. The auxiliary layer 130 may be the above organic thin film, or may be formed from the above composition for an organic thin film.

The active layer 140 may be made of a photoactive material including an electron acceptor made of an n-type semiconductor material and an electron donor made of a p-type semiconductor material.

The electron acceptor and electron donor may form, for example, a bulk heterojunction structure. In the case of the bulk heterojunction structure, when an electron-hole pair excited by light absorbed in the active layer 140 reaches the interface of the electron acceptor and the electron donor by diffusion, electrons and holes are separated by the electron affinity difference of the two materials of the interface. The electrons are moved to a cathode through the electron acceptor and holes are moved to an anode through the electron donor to generate a photocurrent.

The photoactive material may include, for example, at least two selected from polyaniline; polypyrrole; polythiophene; poly(p-phenylenevinylene); benzodithiophene; thienothiophene; MEH-PPV (poly(2-methoxy-5-(2'-ethylhexyloxy)-1,4-phenylene vinylene)); MDMO-PPV (poly(2-methoxy-5-(3,7-dimethyloctyloxy)-1,4-phenylene-vinylene)); pentacene; perylene; poly(3,4-ethylenedioxythiophene) (PEDOT); poly((4,8-bis(octyloxy)benzo(1,2-b:4,5-b)dithiophene)-2,6-diyl-alt-(2-((dodecyloxy)carbonyl)thieno(3,4-b)thiophenediyl)-3,6-diyl) (PTB1); poly((4,8-bis(2-ethylhexyloxy)benzo[1,2-b:4,5-b']dithiophene)-2,6-diyl-alt-(2-((2-ethylhexyloxy)carbonyl)-3-fluorothieno[3,4-b]thiophenediyl)-3,6-diyl) (PTB7); phthalocyanine; tin(II) phthalocyanine (SnPc); copper phthalocyanine; triarylamine; benzidine; pyrazoline; styrylamine; hydrazone; carbazole; thiophene; 3,4-ethylenedioxythiophene (EDOT); pyrrole; phenanthrene; tetracene; naphthalene; rubrene; 1,4,5,8-naphthalene-tetracarboxylic dianhydride (NTCDA); poly(3-hexylthiophene) (P3HT); Alq3; fullerene (C60, C70, C74, C76, C78, C82, C84, C720, and C860); a fullerene derivative, e.g., 1-(3-methoxy-carbonyl)propyl-1-phenyl(6,6)C61 (PCBM), C71-PCBM, C84-PCBM, and bis-PCBM; an inorganic semiconductor, e.g., CdS, CdTe, CdSe, and ZnO; derivatives thereof; and copolymers thereof, but is not limited thereto.

When greater than or equal to two kinds of photoactive materials having different energy levels form a bulk heterojunction, the material having a relatively lower LUMO (lowest unoccupied molecular orbital) level is used as the electron acceptor, and the material having a relatively higher LUMO level is used as the electron donor.

The auxiliary layer 130 is interposed between the lower electrode 120 and the active layer 140, and improves interface characteristics between the lower electrode 120 and the auxiliary layer 130 and/or between the active layer 140 and the auxiliary layer 130 as described above.

Accordingly, charge mobility from the active layer 140 to the lower electrode 120 is improved, and thus life-span characteristics as well as efficiency of a solar cell may be improved.

The auxiliary layer 150 may play a role of increasing charge mobility between the active layer 140 and the upper electrode 160, for example, at least one selected from an electron injection layer, an electron transport layer, a hole blocking layer, a hole injection layer, a hole transport layer, or an electron blocking layer, but is not limited thereto. The auxiliary layer 150 may include, for example, a metal oxide, e.g., $TiO_x$ ($0<x<2$).

The upper electrode 160 may be made of a transparent conductor, e.g., indium tin oxide (ITO), indium zinc oxide (IZO), tin oxide ($SnO_2$), aluminum doped zinc oxide (AZO), and/or gallium doped zinc oxide (GZO), or an opaque conductor, e.g., aluminum (Al), silver (Ag), gold (Au), and/or lithium (Li). The upper electrode 160 may be a cathode or an anode.

Hereinafter, a method of manufacturing the above solar cell is described referring to FIG. 1.

First, a substrate 110 having a lower electrode 120 is prepared, and the above composition for an organic thin film is applied thereon. The composition for an organic thin film may be prepared, for example, through a solution process, and the solution process may include, for example, spin coating, slit coating, and inkjet printing, but is not limited thereto. When the composition for an organic thin film is spin-coated, the spin coating is performed, for example, at about 1000 to about 6000 rpm for about 10 seconds.

Subsequently the coated composition for an organic thin film was heat-treated. The heat treatment may be performed, for example, at about 90° C. to about 150° C. for about 10 to about 90 minutes, but is not limited thereto. The heat treatment may be performed one or more times, and forms an auxiliary layer 130.

An active layer 140 is then formed on the auxiliary layer 130. The active layer 140 may be formed, for example, in a solution process, e.g., spin coating and inkjet printing, or in a chemical vapor deposition method.

An auxiliary layer 150 is formed on the active layer 140. The auxiliary layer 150 may be formed in a solution process, e.g., spin coating and/or inkjet printing, or in a chemical vapor deposition method.

An upper electrode 160 is then formed on the auxiliary layer 150. The upper electrode 160 may be formed by sputtering or depositing a conductor.

Hereinafter, this disclosure is illustrated in more detail with reference to examples and comparative examples. However, these are example embodiments, and this disclosure is not limited thereto.

Synthesis Example 48 g of sodium styrene sulfonate (SSNa) and 19 g of pentafluorostyrene (PFS) are heated and completely dissolved in 0.6 L of dimethylsulfoxide (DMSO) (Sigma Aldrich Co., Ltd.). Subsequently, a solution prepared by dissolving 1 g of azobisisobutyronitrile (AIBN) in dimethylsulfoxide (DMSO) is added thereto in a dropwise fashion for greater than or equal to 24 hours to perform polymerization, and the resultant is precipitated and filtered, obtaining a {P(SSNa-co-PFS)} copolymer including 30 mol % of pentafluorostyrene (PFS).

The copolymer is reacted by using a positive ion-based resin, (for example, Amberlite™ IR-120 Na, which is a gel type acidic cation exchange resin of a sulfonated polystyrene type), and a negative ion-based resin; (for example, Lewatit® MP 62, which is a basic, macroporous anion exchange resin with tertiary amine groups), to obtain a poly(styrenesulfonic acid-perfluorostyrene) copolymer {P(SSA-co-PFS)} aqueous solution.

Subsequently, the poly(styrenesulfonic acid-perfluorostyrene) copolymer {P(SSA-co-PFS)} aqueous solution (containing 20 mol % of PFS) and an ionomer represented by the following Chemical Formula A (Sigma-Aldrich Co., Ltd.) are mixed in a weight ratio of 50:50, a mixed solvent prepared by mixing water and alcohol in a volume ratio of 50:50 is added thereto to have a total solid content of 1.5 wt %, and the mixture is sufficiently agitated for greater than or equal to one hour.

[Chemical Formula A]

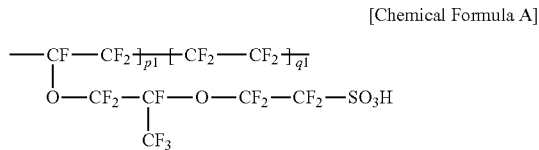

In the formula, p1=1 and q1=5-11.

3,4-ethylenedioxythiophene (EDOT) is added to the obtained mixture, and an ammonium persulfate oxidant is used for polymerization. Salts produced from the reaction as a byproduct are purified in an ion exchange resin or dialysis method, obtaining a conductive compound. The conductive compound includes poly-3,4-ethylenedioxythiophene (PEDOT):poly(styrene sulfonic acid) (PSS):pentafluorostyrene (PFS):ionomer represented by Chemical Formula A in a weight ratio of 1:2.8:1.2:2.

The conductive compound is dissolved in water to prepare a solution. Herein, the conductive compound is included in a ratio ranging from 1.5 to 2.0 wt %.

Preparation of Composition

Preparation Example 1

0.1 volume % of a compound (Dupont Co.) represented by the following Chemical Formula 1a is added to a solution including the conductive compound according to the synthesis example, and the mixture is agitated at room temperature for one hour, preparing a composition.

[Chemical Formula 1a]

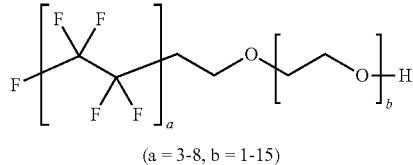

(a = 3-8, b = 1-15)

Preparation Example 2

A composition is prepared according to the same method as Preparation Example 1, except for using 0.5 volume % of the compound represented by Chemical Formula 1a.

Preparation Example 3

A composition is prepared according to the same method as Preparation Example 1, except for using 1.0 volume % of the compound represented by Chemical Formula 1a.

Comparative Preparation Example 1

A composition is prepared according to the same method as Preparation Example 1, except for using no compound represented by the above Chemical Formula 1a.

Comparative Preparation Example 2

A PEDOT:PSS solution (CLEVIOS Co.) is prepared.

Comparative Preparation Example 3

A composition is prepared according to the same method as Preparation Example 1, except for using a PEDOT:PSS solution according to Comparative Preparation Example 2 instead of the conductive compound according to the synthesis example.

Evaluation 1

The compositions according to Preparation Examples 1 to 3 and Comparative Preparation Examples 1 and 2 are respectively spin-coated on a glass substrate and cured at 120° C. for 60 minutes, forming organic thin films.

The contact angle of the organic thin film formed of the compositions according to Preparation Examples 1 to 3 and Comparative Preparation Examples 1 and 2 is measured.

The results are provided in Table 1.

TABLE 1

|  | Contact angle (degree) |
| --- | --- |
| Preparation Example 1 | 63.2 |
| Preparation Example 2 | 65.4 |
| Preparation Example 3 | 70.9 |
| Comparative Preparation Example 1 | 48.8 |
| Comparative Preparation Example 2 | 30.6 |

Evaluation 2

The compositions according to Preparation Example 3 and Comparative Preparation Example 1 are respectively spin-coated on each glass substrate and then cured at 120° C. for 60 minutes, forming organic thin films.

The work function of the organic thin films according to Preparation Example 3 and Comparative Preparation Example 1 is measured. The work function is measured by using ultraviolet (UV) photoelectron spectroscopy (UPS).

The results are provided in Table 2.

TABLE 2

|  | Work function (eV) |
| --- | --- |
| Preparation Example 3 | 5.30 |
| Comparative Preparation Example 1 | 5.27 |

Referring to Table 2, the organic thin film formed of the composition according to Preparation Example 3 shows a substantially equal work function to that of the organic thin film formed of the composition according to Comparative Preparation Example 1. Accordingly, the compound represented by the above Chemical Formula 1a is included but has no substantial influence on the electric characteristic.

Manufacture of Solar Cell

Example 1

An ITO is sputtered on a 1 mm-thick transparent glass substrate to form a 150 nm-thick ITO anode. The composition according to Preparation Example 1 is then spin-coated and dried to form an auxiliary layer on the ITO anode. Subsequently, a compound represented by the following Chemical Formula B and PC71BM are dissolved in chlorobenzene to prepare a solution, and the solution is spin-coated on the auxiliary layer to form an active layer. An aluminum (Al) is then formed on the active layer to form an 80 nm-thick aluminum (Al) cathode, manufacturing a solar cell.

[Chemical Formula B]

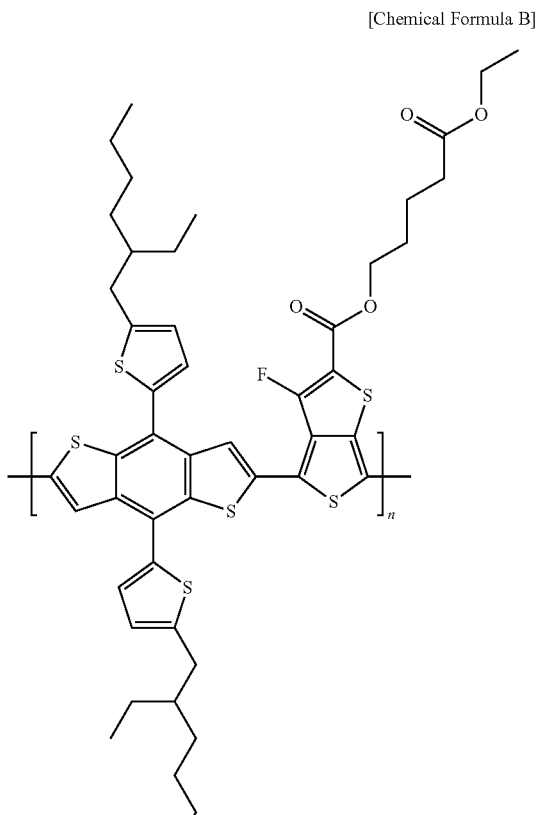

Example 2

A solar cell is manufactured according to the same method as Example 1, except for using the composition according to Example 2 instead of the composition according to Preparation Example 1.

Example 3

A solar cell is manufactured according to the same method as Example 1, except for using the composition according to Example 3 instead of the composition according to Preparation Example 1.

Comparative Example 1

A solar cell is manufactured according to the same method as Example 1, except for using the solution according to Comparative Preparation Example 1 instead of the composition according to Preparation Example 1.

Comparative Example 2

A solar cell is manufactured according to the same method as Example 1, except for using the solution according to Comparative Preparation Example 2 instead of the composition according to Preparation Example 1.

Comparative Example 3

A solar cell is manufactured according to the same method as Example 1, except for using the solution according to Comparative Preparation Example 3 instead of the composition according to Preparation Example 1.

Evaluation 3

Efficiency of the solar cells according to Examples 1 to 3 and Comparative Examples 1 and 2 is evaluated.

The results are provided in Table 3.

TABLE 3

|  | h (%) | Voc (mV) | Jsc (mA/cm$^2$) | FF (%) |
|---|---|---|---|---|
| Example 1 | 8.79 | 776.1 | 15.9 | 71.2 |
| Example 2 | 9.11 | 766.1 | 16.1 | 73.9 |
| Example 3 | 8.69 | 766.1 | 15.8 | 71.8 |
| Comparative Example 1 | 8.49 | 786.2 | 15.5 | 69.7 |
| Comparative Example 2 | 8.35 | 776.1 | 15.6 | 69.0 |

Referring to Table 3, the solar cells according to Examples 1 to 3 show improved efficiency compared with the solar cells according to Comparative Examples 1 and 2.

Evaluation 4

Efficiency of the solar cells according to Examples 1 to 3 and Comparative Examples 1 and 3 is evaluated.

The efficiency is evaluated as normalized power conversion efficiency. The normalized power conversion efficiency is defined as output electric power relative to input electric power, and is calculated according to the following calculation equation.

$$\eta = P_{out}/P_{in} = J_m V_m/P_{in} = J_{sc} V_{oc}/P_{in}$$

($\eta$=power conversion efficiency, $P_{in}$=input power, $P_{out}$=output power, $J_m$=maximum current, $V_m$=maximum voltage, $J_{sc}$=short-circuit current density, $V_{oc}$=open-circuit voltage, and FF=fill factor)

Figure 2:
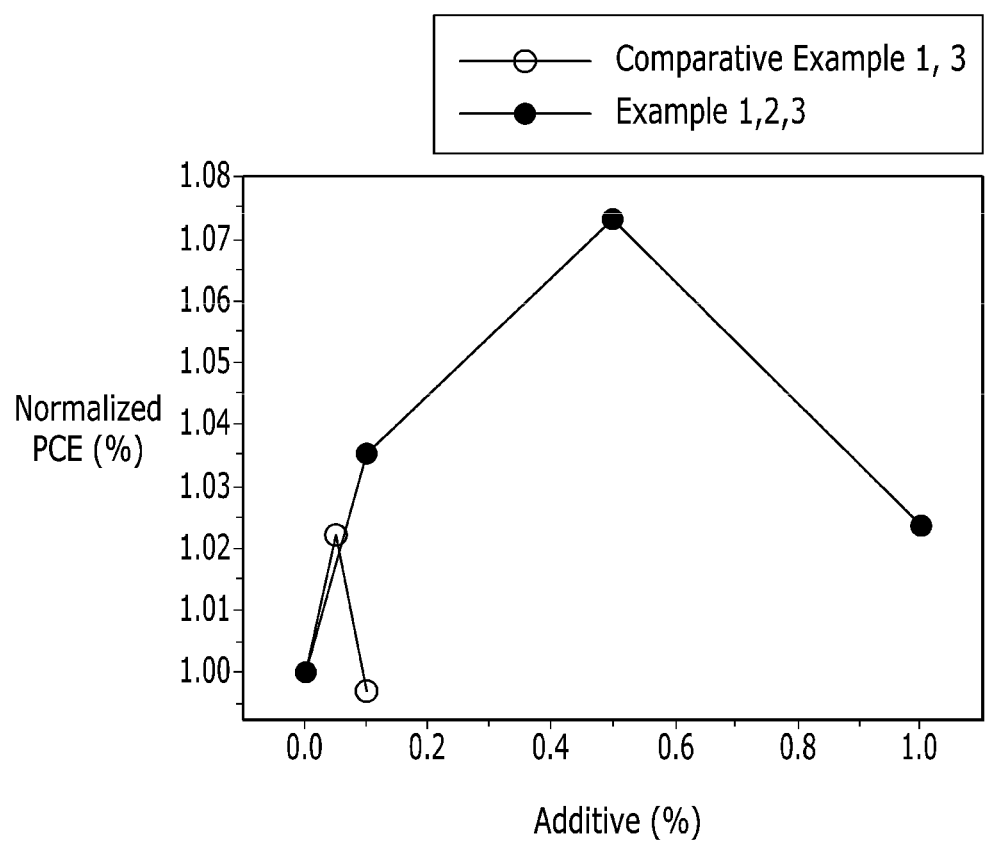
FIG. 2 is a graph showing efficiency of solar cells according to Examples 1 to 3 and Comparative Examples 1 and 3.

The results are provided in FIG. 2.

FIG. 2 is a graph showing efficiency of the solar cell according to Examples 1 to 3 and Comparative Examples 1 and 3.

Referring to FIG. 2, the solar cells according to Examples 1 to 3 show higher power conversion efficiency than the solar cells according to Comparative Examples 1 and 2.

Evaluation 5

Life-span characteristics of the solar cells according to Example 2 and Comparative Example 1 are evaluated.

The life-span characteristics are evaluated by comparing current density and efficiency of the solar cells according to Example 2 and Comparative Example 1 while the solar cells are stored in the air for 600 hours and operated when necessary.

Figure 3:
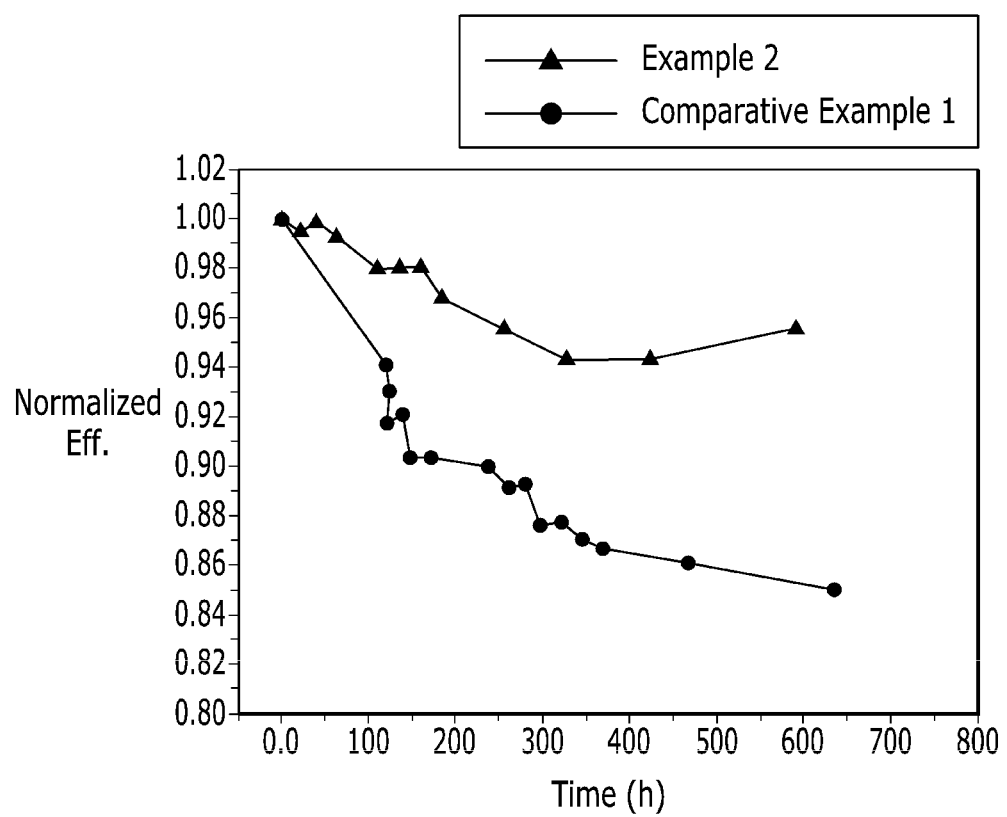
FIG. 3 is a graph showing life-span characteristics of the solar cells according to Example 2 and Comparative Example 1.

The results are provided in FIG. 3.

FIG. 3 is a graph showing life-span characteristics of the solar cell according to Example 2 and Comparative Example 1.

Referring to FIG. 3, the solar cell according to Example 1 shows about 5% decreased efficiency over 600 hours, while the solar cell according to Comparative Example 1 shows greater than or equal to about 15% decreased efficiency over 600 hours. Accordingly, the solar cell according to Example 1 shows an improved life-span characteristic compared with the solar cell according to Comparative Example 1.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. A composition for an organic thin film comprising:

a first compound represented by the following Chemical Formula 1a:

[Chemical Formula 1a]

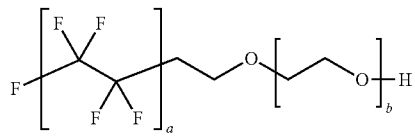

wherein, in the Chemical Formula 1a, a and b are independently integers ranging from 1 to 100;

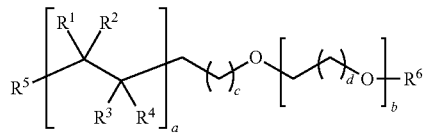

a second compound including one of a conductive polymer, a metal salt, a hydrate of the metal salt, and a combination thereof, the conductive polymer including, a moiety represented by the following Chemical Formula 2, a moiety represented by the following Chemical Formula 3, a moiety represented by the following Chemical Formula 4, and at least one of a moiety represented by the following Chemical Formula 5 and a moiety represented by the following Chemical Formula 6:

[Chemical Formula 2]

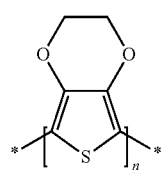

[Chemical Formula 3]

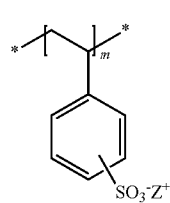

[Chemical Formula 4]

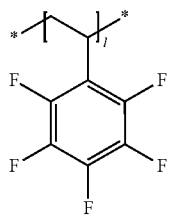

[Chemical Formula 5]

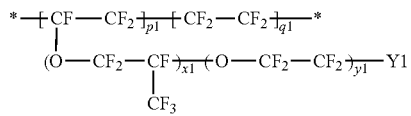

[Chemical Formula 6]

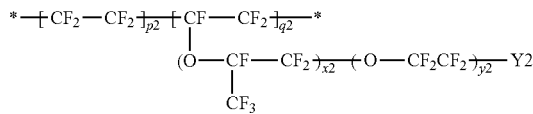

wherein, in the Chemical Formulae 2 to 6, $Z^+$ is a cation, n, m, and l denote mole numbers of each moiety represented by Chemical Formulae 2 to 4 and satisfy $0.0001 \le n/m \le 1$ and $0.0001 \le l/m \le 1$, p1, q1, p2, and q2 independently satisfy $0 < p1 \le 10,000,000$, $0 < q1 \le 10,000,000$, $0 < p2 \le 10,000,000$, and $0 < q2 \le 10,000,000$, x1, y1, x2, and y2 are independently integers ranging from 0 to 20, and Y1 and Y2 are independently one of —COO$^-$M$^+$, —SO$_3$M$^+$, and —PO$_3^{2-}$ (M$^+$)$_2$, wherein M$^+$ is one of Na$^+$, K$^+$, Li$^+$, H$^+$, and NH$^{4+}$, and the metal salt being one of a niobium salt, a molybdenum salt, a tungsten salt, a nickel salt, a titanium salt, and a combination thereof.

2. The composition for an organic thin film of claim 1, wherein the first compound is included in an amount of about 0.001 volume % to 5 volume % based on the total amount of the composition.

3. The composition for an organic thin film of claim 2, wherein the first compound is included in an amount between greater than or equal to about 0.01 volume % and less than about 2 volume % based on the total amount of the composition.

4. The composition for an organic thin film of claim 1, further comprising a solvent, and the solvent is at least one selected from deionized water, methanol, ethanol, propanol, isopropanol, 2-methoxyethanol, 2-ethoxyethanol, 2-propoxyethanol 2-butoxyethanol, methylcellosolve, ethylcellosolve, diethyleneglycolmethylether, diethyleneglycolethylether, dipropyleneglycolmethylether, toluene, xylene, hexane, heptane, octane, ethylacetate, butylacetate, diethyleneglycoldimethylether, diethyleneglycoldimethylethylether, methylmethoxypropionic acid, ethylethoxypropionic acid, ethyllactic acid, propyleneglycolmethyletheracetate, propyleneglycolmethylether, propyleneglycolpropylether, methylcellosolveacetate, ethylcellosolveacetate, diethyleneglycolmethylacetate, diethyleneglycolethylacetate, acetone, methylisobutylketone, cyclohexanone, dimethylformamide (DMF), dimethylsulfoxide, N,N-dimethylacetamide (DMAc), N-methyl-2-pyrrolidone, γ-butyrolactone, diethylether, ethyleneglycoldimethylether, diglyme, tetrahydrofuran, acetylacetone, chlorobenzene, acetonitrile, or a combination thereof.

5. An organic thin film manufactured from the composition for an organic thin film according to claim 1.

6. An electronic device comprising:
a first electrode;
a second electrode facing the first electrode;
an active layer between the first electrode and the second electrode; and
an auxiliary layer between at least one of the first electrode and the active layer and the second electrode and the active layer,
wherein the auxiliary layer includes a first compound represented by the following Chemical Formula 1a:

[Chemical Formula 1a]

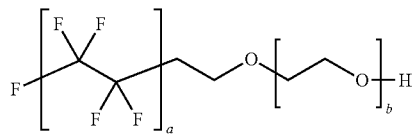

wherein, in the Chemical Formula 1a,
a and b are independently integers ranging from 1 to 100; and

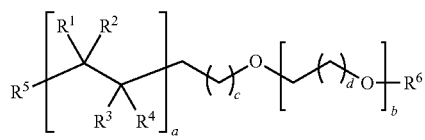

a second compound including one of a conductive polymer and a metal oxide, the conductive polymer including,
a moiety represented by the following Chemical Formula 2,
a moiety represented by the following Chemical Formula 3,
a moiety represented by the following Chemical Formula 4, and
at least one of a moiety represented by the following Chemical Formula 5 and a moiety represented by the following Chemical Formula 6:

[Chemical Formula 2]

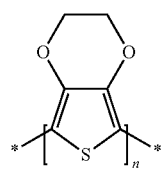

[Chemical Formula 3]

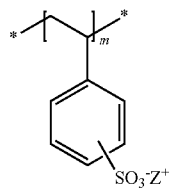

[Chemical Formula 4]

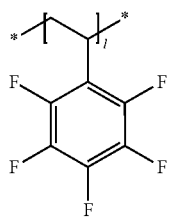

[Chemical Formula 5]

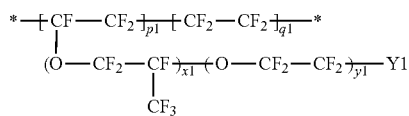

[Chemical Formula 6]

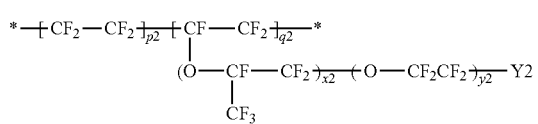

wherein, in the Chemical Formulae 2 to 6,
$Z^+$ is a cation,
n, m, and l denote mole numbers of each moiety represented by Chemical Formulae 2 to 4 and satisfy $0.0001 \leq n/m \leq 1$ and $0.0001 \leq l/m \leq 1$,
p1, q1, p2, and q2 independently satisfy $0 < p1 \leq 10{,}000{,}000$, $0 < q1 \leq 10{,}000{,}000$, $0 < p2 \leq 10{,}000{,}000$, and $0 < q2 \leq 10{,}000{,}000$,
x1, y1, x2, and y2 are independently integers ranging from 0 to 20, and
Y1 and Y2 are independently one of $-COO^-M^+$, $-SO_3^-M^+$, and $-PO_3^{2-}(M^+)_2$, wherein $M^+$ is one of $Na^+$, $K^+$, $Li^+$, $H^+$, and $NH_4^+$, and
the metal oxide including one of niobium oxide, molybdenum oxide, tungsten oxide, nickel oxide, titanium oxide, and a combination thereof.

7. The electronic device of claim 6, wherein the auxiliary layer has a contact angle of about 50 to about 85 degrees.

8. The electronic device of claim 6, wherein the auxiliary layer has a work function of about 5.2 to 5.6 eV.

9. The electronic device of claim 6, wherein the electronic device is one of a solar cell and an organic light emitting diode.

* * * * *